(12) United States Patent
Maeda et al.

(10) Patent No.: US 10,581,396 B2
(45) Date of Patent: Mar. 3, 2020

(54) ELECTRIC TRANSMISSION CABLE MODULE AND TRANSMISSION LOSS COMPENSATION CIRCUIT

(71) Applicant: Hitachi Metals, Ltd., Minato-ku, Tokyo (JP)

(72) Inventors: Koji Maeda, Tokyo (JP); Izumi Fukasaku, Tokyo (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 15/987,024

(22) Filed: May 23, 2018

(65) Prior Publication Data

US 2018/0342997 A1    Nov. 29, 2018

(30) Foreign Application Priority Data

May 24, 2017   (JP) .................... 2017-102611

(51) Int. Cl.
| | | |
|---|---|---|
| *H03G 3/30* | (2006.01) | |
| *H03F 3/04* | (2006.01) | |
| *H03F 1/02* | (2006.01) | |
| *H03F 3/24* | (2006.01) | |
| *H03F 3/195* | (2006.01) | |
| *H03F 3/45* | (2006.01) | |
| *H04L 25/03* | (2006.01) | |

(52) U.S. Cl.
CPC ............ *H03G 3/30* (2013.01); *H03F 1/0205* (2013.01); *H03F 3/04* (2013.01); *H03F 3/195* (2013.01); *H03F 3/245* (2013.01); *H03F 3/45475* (2013.01); *H03G 3/3036* (2013.01); *H03F 2200/102* (2013.01); *H03F 2200/135* (2013.01); *H03F 2200/405* (2013.01); *H03F 2200/451* (2013.01); *H04L 25/03878* (2013.01)

(58) Field of Classification Search
USPC .................... 330/278, 310, 98, 133, 150
See application file for complete search history.

(56) References Cited

U.S. PATENT DOCUMENTS 7,664,468 B2 *  2/2010  Wong ................ H04B 1/18
                                                 330/302
2009/0052559 A1  2/2009  Iwasaki

FOREIGN PATENT DOCUMENTS

| JP | 2004-48141 A | 2/2004 |
|---|---|---|
| JP | 2009-49672 A | 3/2009 |

\* cited by examiner

*Primary Examiner* — Hieu P Nguyen
(74) *Attorney, Agent, or Firm* — Crowell & Moring LLP (57) ABSTRACT

Provided is an electric transmission cable module that has both a squelch function and an AGC function, and realizes a highly accurate function while suppressing an increase in chip cost. Disclosed is an electric transmission cable module including a first amplifier that compensates for a cable loss of a conductive cable, a second amplifier having a variable gain function, a third amplifier allowed to transit between a normal state for amplifying a signal and an idle state having smaller power consumption than power consumption in the normal state, a detector that detects a signal level on a signal transmission line between the first amplifier and the third amplifier, an analog-to-digital conversion circuit that converts the signal level into a digital signal, a first control circuit that generates a gain adjustment signal for controlling a gain of the second amplifier based on the digital signal, and a second control circuit that controls transition between the normal state and the idle state of the third amplifier based on the digital signal.

8 Claims, 8 Drawing Sheets

| STATE/MODE | REFERENCE VALUE Vref | SWITCH 520 INPUT |
|---|---|---|
| IDLE | FIXING FOR SQUELCH | COMPARATOR 534 OUTPUT |
| NORMAL/ SQUELCH | FIXING FOR SQUELCH | COMPARATOR 534 OUTPUT |
| NORMAL/ AGC | SWEEP | 1:Enable |

Fig. 8

ELECTRIC TRANSMISSION CABLE MODULE AND TRANSMISSION LOSS COMPENSATION CIRCUIT

TECHNICAL FIELD

The present invention relates to a communication cable module, and more particularly to a cable module which is equipped with an amplifier that compensates for cable loss and has a function of saving power in an idle state.

BACKGROUND ART

Patent Document 1 describes a technique of connecting a switch between a load resistor and a power supply (GND) and reducing current during idling by switching ON/OFF of a switch during operation and idling.

Patent Document 2 describes that squelch control is performed in a technique of retransmitting a signal using a repeater after receiving the signal using a receiving antenna in order to transmit a broadcast to an area such as building shadow where radio waves do not reach.

CITATION LIST

Patent Document

Patent Document 1: JP 2009-49672 A
Patent Document 2: JP 2004-48141 A

SUMMARY OF THE INVENTION

Problems to be Solved by the Invention

For example, in a case in which an electric transmission cable module (also referred to as a direct attach cable (DAC)) is used for rack-to-rack communication inside a rack of a data center, when a transmission speed increases, transmission loss in a high frequency band increases, and thus a transmission distance becomes shorter. For this reason, in recent years, an active copper cable (ACC) module that enables long distance transmission has been developed and manufactured by installing a continuous time linear equalizer integrated circuit (CTLE IC) for transmission loss compensation in the electric transmission cable module.

It is desired that the ACC module transits to an idle state to reduce power consumption and not to output an unnecessary wave causing malfunction of a host IC in a connection target device when no signal is input. Such a function may be referred to as a squelch function, etc.

The above-mentioned patent document 1 shows a method of turning ON/OFF a switch connected between a load resistor and a power supply at the time of transition during operation and idling.

Meanwhile, the electric transmission cable module includes an auto gain control (AGC) circuit that automatically adjusts gain so that an output level becomes constant in order to match with a receiver side circuit. Such an AGC circuit is desirable, for example, in a receiver in a connection target device so as not to cause bit error rate (BER) degradation due to large signal distortion.

With regard to this point, even though use and a system configuration are different, Patent Document 2 discloses a circuit configuration that performs both squelch control and output control.

As described above, it is desirable that the electric transmission cable module has both the squelch function and the AGC function. Therefore, the inventors examined a circuit configuration of the electric transmission cable module having both functions.

Figure 1:
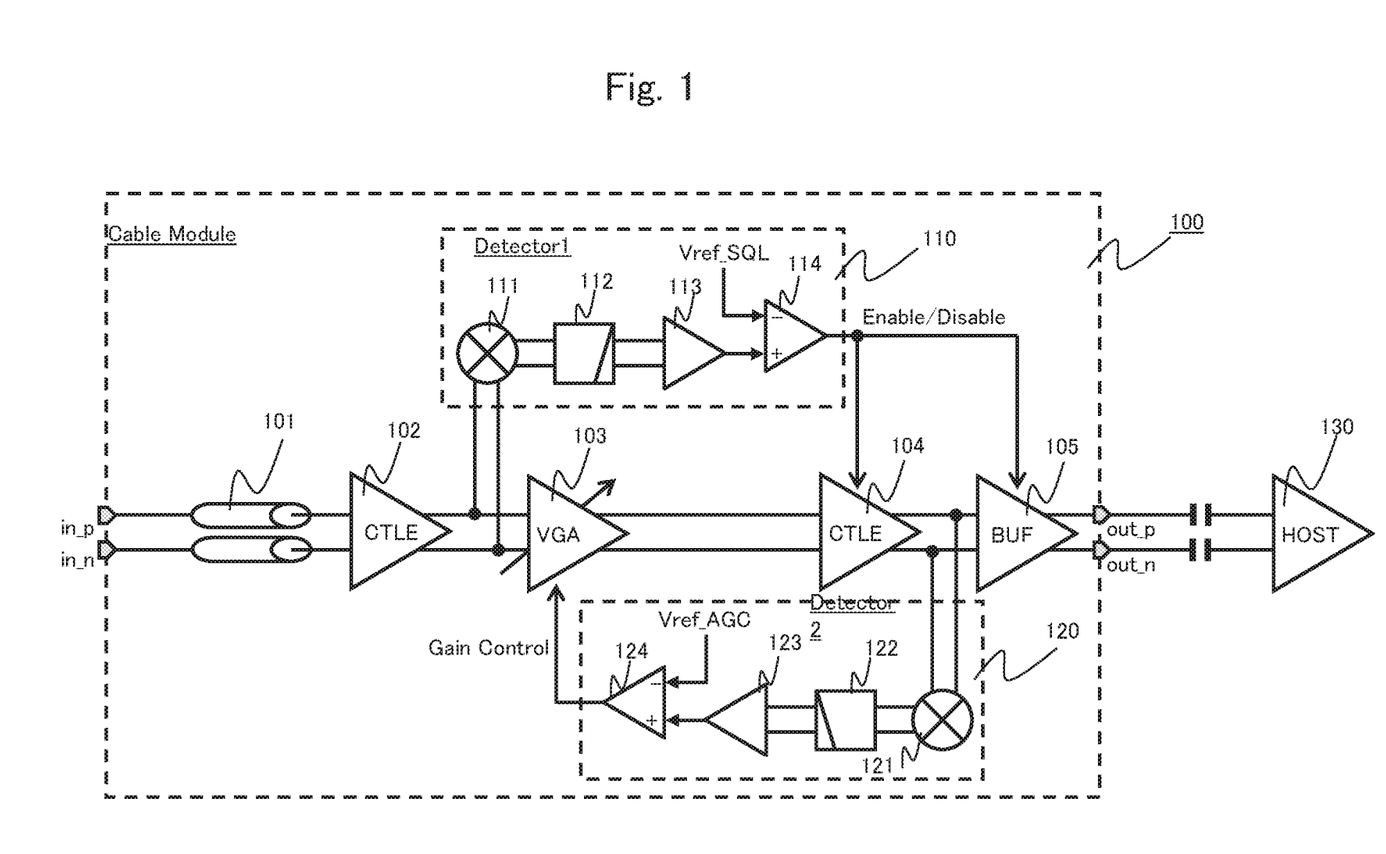
FIG. 1 is a circuit block diagram of a comparative example of an electric transmission cable module for describing a problem of the invention.

FIG. 1 is an example of a circuit block diagram of the electric transmission cable module studied by the inventors. This electric transmission cable module 100 transmits electric signals by a copper cable 101 among arbitrary devices. For example, a differential signal from a certain device is transmitted from input terminals in P and in N to the copper cable 101 and input from output terminals out P and out N to a host 130 corresponding to a connection target device. For example, an interface includes a circuit of one chip or one board from an exit of the copper cable 101 to the output terminals out P and out N.

An electric signal from the copper cable 101 is input to a continuous time linear equalizer (CTLE) 102. The CTLE 102 is an amplifier circuit that functions as a type of linear equalizer amplifier and has a frequency characteristic that compensate for a frequency characteristic of the transmission line (copper cable 101). A variable gain amplifier (VGA) 103 automatically adjusts the gain so that an output level becomes constant. The frequency characteristic of automatically adjusted electric signal is further compensated for using another CTLE 104 as necessary. The CTLE 104 may be omitted according to a case. An output of the CTLE 104 is set to an appropriate value by a buffer amplifier (BUF) 105 and output from the output terminals out P and out N.

In general, a circuit of the host 130 connected to the output terminals out P and out N is manufactured by a fine CMOS process enabling high-speed signal processing, and thus has a low withstand voltage. On the other hand, a circuit mounted in the electric transmission cable module 100 attaches importance to linearity and cost, and thus may be manufactured by a BiCMOS process capable of applying 3.3 V power which far exceeds the withstand voltage of the fine CMOS process. For example, a frequency of an electrical signal transmitted through the copper cable 101 is 50 GBPS, and a frequency band of 10 GHz or more is assumed as a frequency band to be handled.

In order to implement the squelch function and the AGC function in such an electric transmission cable module 100, a detector is required for each function. A squelch detector 110 for detecting presence or absence of a signal is necessary for the squelch function, and an AGC detector 120 for detecting a level of the signal is necessary for the squelch function.

In the squelch detector 110, a differential output of the CTLE 102 is input to a mixer (multiplier) 111 and multiplied by an input signal, thereby frequency-converting the signal into a DC band and detecting power in the DC band, which corresponds to a so-called envelope detection type detector. A frequency of an output of the mixer 111 is lowered to a substantially DC level by a low-pass filter 112, and the output is amplified by the amplifier 113 as necessary and input to the comparator 114. Vref_SQL serving as a squelch reference voltage is input to the comparators 114. When the input signal is smaller than Vref_SQL, for example, a disable signal is generated and the operations of the CTLE 104 and a buffer amplifier 105 are suspended.

In the AGC detector 120, basically, similarly to the squelch detector 110, an output of the CTLE 104 is input to the mixer 121, a frequency of an output of the mixer 121 is lowered to a substantially DC level by a low-pass filter 122, and the output is amplified by the amplifier 123 as necessary and input to the comparator 124. Vref AGC serving as a reference voltage for AGC is input to the comparator 124. For example, when the input signal is equal to or less than Vref_SQL, a gain control signal for increasing a predetermined value gain is input to a variable gain amplifier and adjusted, and feedback control is performed so that the input signal becomes equal to Vref_SQL.

As described above, in the example of FIG. 1, two detectors 110 and 120 are required, and each detector performs an operation of detecting an input level as a power detector. The low-pass filters 112 and 122 need to have high accuracy to improve level detection accuracy of the power detector. That is, in order to lower a cutoff frequency of the filter, it is necessary to increase a product of a resistance and a capacitor. However, when the resistance is excessively large, noise becomes worse and the detection accuracy decreases. For this reason, in order to construct a high-precision low-pass filter, a large capacitor is required, so that a circuit area increases. An area of the capacitor is, for example, 2 to 3 times an area of one amplifier or more. For this reason, a chip area increases and the manufacturing cost increases.

Accordingly, an object of the invention is to provide an electric transmission cable module that has both the squelch function and the AGC function, and realizes a highly accurate function while suppressing an increase in chip cost.

Solutions to Problems

An aspect of the invention is an electric transmission cable module including a first amplifier that compensates for a cable loss of a conductive cable, a second amplifier having a variable gain function, a third amplifier allowed to transit between a normal state for amplifying a signal and an idle state having smaller power consumption than power consumption in the normal state, a detector that detects a signal level on a signal transmission line between the first amplifier and the third amplifier, an analog-to-digital conversion circuit that converts the signal level into a digital signal, a first control circuit that generates a gain adjustment signal for controlling a gain of the second amplifier based on the digital signal, and a second control circuit that controls transition between the normal state and the idle state of the third amplifier based on the digital signal.

An aspect of the invention is an electric transmission cable module including a first amplifier that compensates for a cable loss of a conductive cable, a second amplifier having a variable gain function, a third amplifier allowed to transit between a normal state for amplifying a signal and an idle state having smaller power consumption than power consumption in the normal state, a detector that detects a signal level on a signal transmission line between the first amplifier and the third amplifier, a comparator that compares the signal level with a reference signal, and a control circuit for switching to a first mode for changing the reference signal and a second mode for setting the reference signal to a fixed value, wherein in the first mode, the third amplifier is maintained in the normal state and a gain adjustment signal for controlling a gain of the second amplifier based on an output of the comparator is generated, and in the second mode, transition between the normal state and the idle state of the third amplifier is controlled based on an output of the comparator.

An aspect of the invention is a transmission loss compensation circuit including a linear equalizer connected to a conductive cable, a variable gain amplifier for controlling a level of an output of the linear equalizer, at least one amplifier located behind the variable gain amplifier, a detector that receives at least one of outputs of the linear equalizer and the variable gain amplifier as an input and detects a signal level using a low-pass filter, an auto gain control (AGC) control circuit that controls a gain of the variable gain amplifier based on an output of the detector, and a squelch control circuit that controls power consumption of at least one of the amplifiers based on an output of the detector, wherein the AGC control circuit and the squelch control circuit receive a digital signal obtained by analog-to-digital conversion of an output of the detector as an input and perform control based on the digital signal, or the detector includes a comparator that receives the signal level and a reference value as an input, and the AGC control circuit and the squelch control circuit perform control based on an output of the comparator.

Effects of the Invention

According to the invention, it is possible to provide an electric transmission cable module that has both a squelch function and an AGC function, and realizes a highly accurate function while suppressing an increase in chip cost.

MODE FOR CARRYING OUT THE INVENTION

In a configuration of the invention described below, the same reference numerals are used for the same parts or parts having similar functions in different drawings, and redundant description may be omitted. In a case in which there is a plurality of elements having the same or similar functions, description will be given by assigning different suffixes to the same reference numerals in some cases. However, when there is no need to distinguish between a plurality of elements, subscripts may be omitted for description in some cases.

Notations such as "first", "second", "third", etc. in this specification, etc. are provided for identifying constituent elements and do not necessarily restrict the number, an order, or contents thereof. In addition, a number for identifying a constituent element is used for each context, and a number used in one context does not necessarily indicate the same configuration in another context. In addition, it does not preclude that a constituent element identified by a certain number has a function of a constituent element identified by another number.

A position, a size, a shape, a range, etc. of each of components illustrated in drawings, etc. may not indicate an actual position, size, shape, range, etc. to facilitate understanding of the invention. For this reason, the invention is not necessarily limited to the position, size, shape, range, etc. disclosed in the drawings, etc.

An outline of a representative example is shown below. That is, a communication cable module of the present embodiment has a cable made of, for example, a copper wire, a silver wire, etc. as a conductive cable, a linear amplifier for equalizing a cable loss, a detector for detecting presence or absence of an input signal, a current variable function, and a common mode voltage adjustment function. When the input signal is absent, the current variable function reduces a current of the linear amplifier and the common mode voltage adjustment function makes a linear amplifier output common mode voltage constant.

First Embodiment (1-1. Circuit Configuration)

Figure 2:
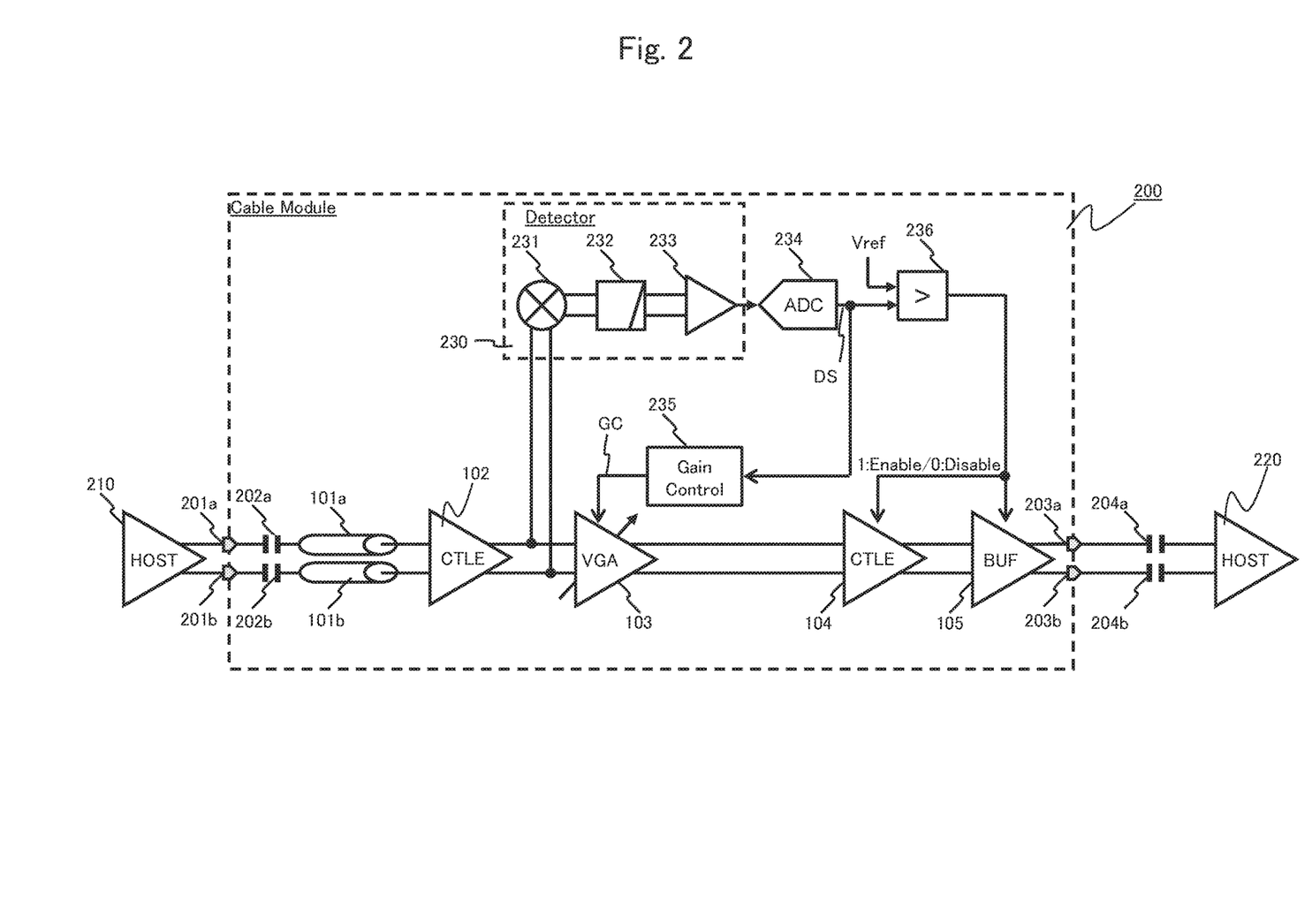
FIG. 2 is a circuit block diagram of a first embodiment of the invention.

FIG. 2 is a circuit block diagram illustrating an electric transmission cable module according to a first embodiment of the invention. The present embodiment shows an example in which an electric signal is transmitted from a transmitter IC 210 of a transmission side host, which is a transmission side apparatus, to a receiver IC 220 of a receiver side host, which is a receiver side apparatus, using copper cables 101a and 101b. A frequency of the transmitted signal is 50 GBPS.

Signals are input from the transmitter IC 210 to input terminals 201a and 201b of an electric transmission cable module 200. In the present embodiment, transmission of a differential signal is taken as an example. However, the invention may not be limited to the differential signal.

A differential signal transmitted from the transmitter IC 210 is input to the electric transmission cable module 200 from the input terminals 201a and 201b. In the electric transmission cable module 200, input to the copper cables 101a and 101b is performed through AC coupling capacitances 202a and 202b for separating operating voltages of the transmitter IC 210 and the CTLE 102.

The copper cables 101a and 101b is impedance matched with the transmitter IC 210, and loss due to reflection is sufficiently small. The amplitude of a high frequency component of a differential signal output from the copper cables 101a and 101b is reduced due to the cable loss. The differential signal output from the copper cables 101a and 101b is input to the CTLE 102.

The CTLE 102 is an amplifier having an inverse characteristic of the cable loss. When the amplitude of the high frequency component is amplified, a differential signal is waveform-equalized so as to have a waveform close to an output of the transmitter IC 210. The differential signal output from the CTLE 102 is input to the VGA 103. The VGA 103 automatically adjusts gain so that a level of an output to the receiver IC 220 is constant.

The automatically adjusted electric signal is further compensated for the frequency characteristic by another CTLE 104 as necessary. The CTLE 104 may be omitted depending on the case. In addition, two or more CTLE may be present. An output of the CTLE 104 is input to the buffer amplifier 105.

The buffer amplifier 105 is an amplifier that performs linear amplification, and impedance matching with a circuit in the receiver side host 220 is taken. A differential signal output from the buffer amplifier 105 is output from output terminals 203a and 203b. On the receiver side, input to the receiver IC 220 is performed through AC coupling capacitances 204a and 204b for separating operating voltages of the buffer amplifier 105 and the receiver IC 220.

As described above, the electric transmission cable module 200 enables long-distance transmission between the transmitter IC 210 and the receiver IC 220 by equalizing the cable loss of the copper cables 101a and 101b using the CTLE 102 and the CTLE 104.

In the present embodiment, a detector 230 contributing to both the squelching function and the AGC function is provided. The detector 230 detects an input signal level. The detected signal level is digitized by an analog-to-digital converter (ADC). Further, a determination circuit for determining whether to transit to an idle state based on digitized power information and a circuit for automatically adjusting gain so that an output level becomes constant based on the digitized power information are included.

An output from the CTLE 102 is connected to the detector 230 separately from the VGA 103, and the detector 230 constantly monitors an output level of the CTLE 102. In the detector 230, a differential output from the CTLE 102 is squared by the mixer 231, a signal is frequency-converted into a DC band, and power is detected in the DC band. A DC component is extracted from an output of the mixer 231 using a low-pass filter 232, and a second harmonic component, etc. of a signal is suppressed to detect a voltage level. The low-pass filter 232 generally includes a capacitor as a component.

The voltage level is converted into an appropriate output level to a circuit of a subsequent stage by a linear amplifier 233. The output level of the linear amplifier 233 is digitized by an analog-to-digital converter (ADC) 234 to obtain a digital output signal DS. The digital output signal DS is a numerical value reflecting an output level of the CTLE 102.

In the embodiment illustrated in FIG. 2, the detector 230 is of an envelope detection type using the mixer 231. As another method, an envelope detection method using non-linearity (even order distortion) of a diode may be used instead of the mixer. Further, it is possible to include a detector of another known type that can detect a level of an input signal.

In order to realize the AGC function, the digital output signal DS of the ADC 234 is input to a gain controller 235. For example, the gain controller 235 stores a correspondence table between a numerical value of a digital output signal DS and gain of the VGA 103, generates a gain adjustment signal GC corresponding to the digital output signal DS, and controls the gain of the VGA 103.

Next, the squelch function will be described. When the transmitter IC 210 is not outputting a signal, the electric transmission cable module 200 transits to the idle mode. The purpose of the idle mode transition is to reduce power consumption by lowering the current of the buffer amplifier 105 (or even the CTLE 104), and to prevent, for example, an unnecessary wave generated by unplugging a cable, etc. from being input to the receiver IC 220 to cause a malfunction between hosts by lowering the AC gain of the buffer amplifier 105.

In order to realize the squelch function, a digital output signal DS of the ADC 234 is input to a comparator 236. In the comparator 236, the digital output signal DS is compared with a reference value Vref. When the digital output signal DS is larger than the reference value Vref, for example, a value "1" is input to the CTLE 104 and the buffer amplifier 105 as a signal indicating Enable. When the output level of the linear amplifier 233 is equal to or lower than the reference value Vref, for example, a value "0" is input to the CTLE 104 and the buffer amplifier 105 as a signal indicating Disable.

The buffer amplifier 105 to which the value "1" is input controls the current supplied to the buffer amplifier 105 so that a current value of the buffer amplifier 105 and an output common potential become optimum for outputting a signal to the receiver side host 220. The CTLE 104 to which the value "1" is input controls the supplied current and voltage to equalize the waveform such that the output signal has a waveform close to the output of the transmitting IC 210 of the transmission side host. This state will be referred to as a "normal state". In the normal state, the CTLE 104 and the buffer amplifier 105 operate, the VGA 103 is controlled, and auto gain control operates.

On the other hand, when the transmitter IC 210 of the transmission side host is not outputting a signal, the digital output signal DS becomes equal to or lower than the reference value Vref, and thus the comparator 236 outputs the value "0" as a signal indicating Disable to the CTLE 104 and the buffer amplifier 105. The CTLE 104 and the buffer amplifier 105 to which the value "0" is input are supplied with a small current so that the power is reduced when compared to a case in which the value "1" is input. This state will be referred to as an "idle state".

(1-2. Operation Sequence)

Figure 3:
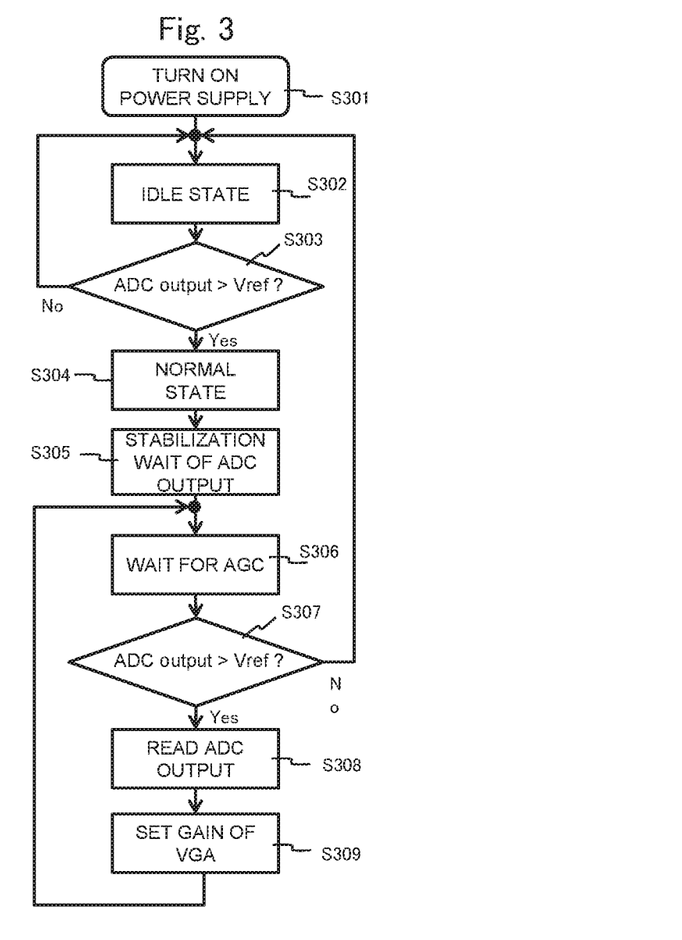
FIG. 3 is a flowchart illustrating an operation of the first embodiment of the invention.

FIG. 3 is a flowchart illustrating an operation sequence of FIG. 2.

Figure 4:
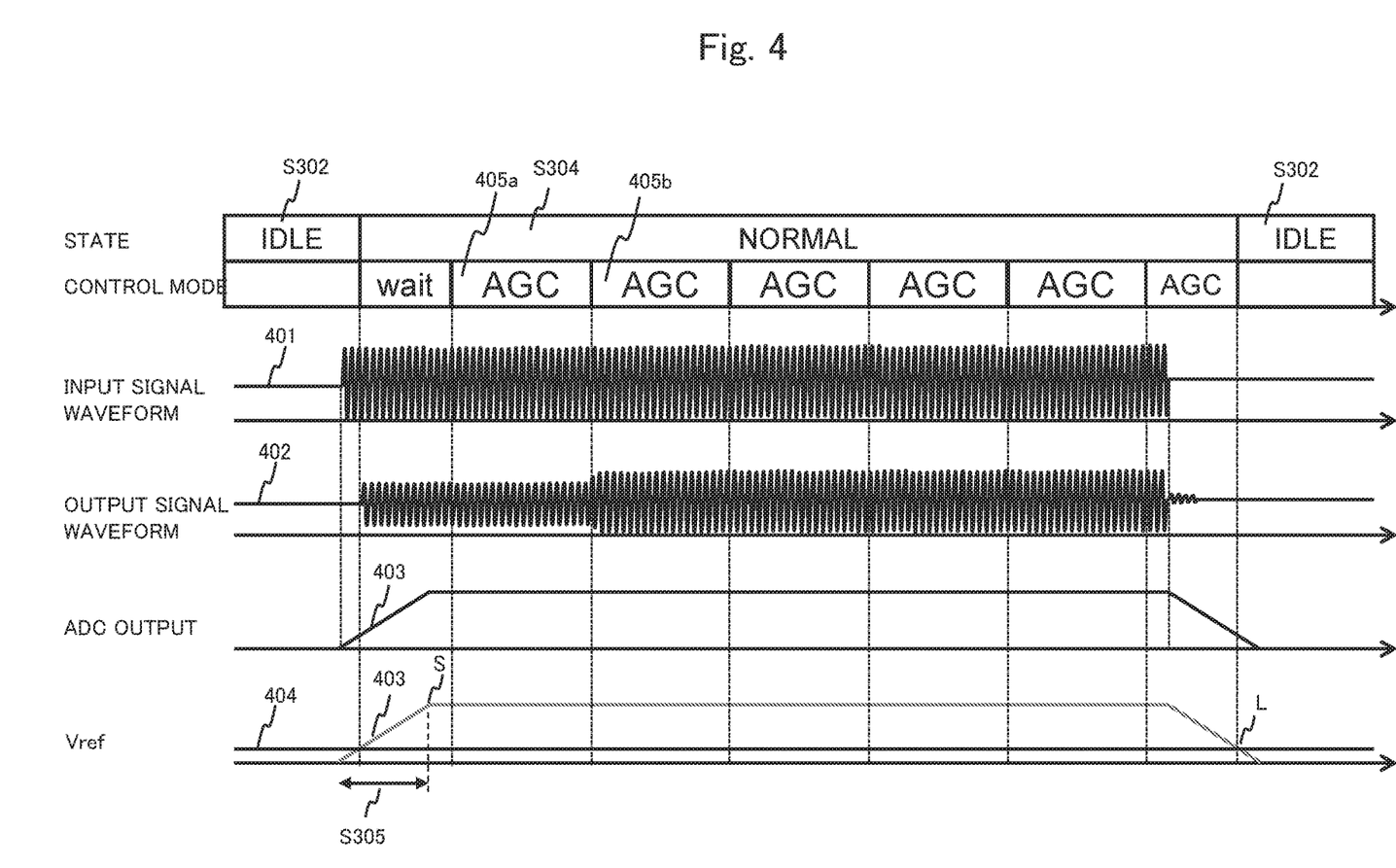
FIG. 4 is a waveform diagram during operation of the first embodiment of the invention.

FIG. 4 illustrates waveforms of the circuit of FIG. 2 during operation. FIG. 4 illustrates a state of the electric transmission cable module 200, a control mode, a waveform of an input signal to the electric transmission cable module 200 (input to an input terminal 201) 401, a waveform of an output signal from the electric transmission cable module 200 (output from an output terminal 204) 402, an output 403 from the ADC 234, and a relationship between a reference value Vref 404 and the output 403 from the ADC in order from the top.

An operation of the circuit of FIG. 2 will be described with reference to FIG. 3 and FIG. 4. First, a power supply of the electric transmission cable module 200 is turned ON (S301). Normally, when the electric transmission cable module 200 is connected to the transmitter IC 210 (or the receiver IC 220), power is supplied from the host to automatically turn ON the power supply.

Subsequently, the electric transmission cable module 200 transits to the idle state as an initial state (S302). In the idle state, a value "0" is input to the CTLE 104 and the buffer amplifier 105 as a signal indicating Disable.

During the idle state, the comparator 236 compares the digital output signal DS of the ADC 234 with the reference value Vref (S303). When the output of the ADC 234 is equal to or lower than Vref, it is determined that there is no output of the transmitter IC 210, and the idle state is maintained.

When a signal is input and the digital output signal DS (input of the comparator 236) of the ADC 234 exceeds Vref, the state transits to the normal state (S304). A process of shifting from the idle state (S302) to the normal state (S304) after turning ON the power (S301) will be described in detail with reference to FIG. 4 in addition to FIG. 3. When the waveform of the input signal 401 to the electric transmission cable module 200 transits from a signal-free state to a signal-present state (a state including a high-frequency signal of 50 GBPS in the present embodiment) during the idle state (S302), the detector 230 detects a signal level and inputs the detected signal level to the ADC 234 via the linear amplifier 233. As illustrated in the ADC output 403 of FIG. 4, in general, a predetermined time is required for a rise of the ADC output 403 since a rise of the output signal of the detector 230 is delayed by a time constant of the low-pass filter 232. Therefore, until the ADC output 403 is stabilized, the automatic gain control by the VGA 103 is put in a waiting state (S305). That is, in FIG. 4, the waiting state (S305) continues until the timing indicated by S, and the automatic gain control is held. According to this configuration, automatic gain control can be stably performed.

In the present embodiment, the auto gain control periodically checks the output level and controls the AGC amplifier. That is, as illustrated in FIG. 4, during one cycle AGC control 405, the signal level is checked, and an output level of a subsequent period is controlled by adjusting the gain of the AGC amplifier. In a sequence at the time of turning ON the power supply, a start of a subsequent AGC period is waited for (S306) subsequently to a stabilization wait of the ADC output (S305).

In the example of FIG. 4, the AGC control 405 is periodically performed (S306 to S309) after the ADC output is stabilized (after the timing of S in FIG. 4). As illustrated in FIG. 3, when the timing of the start of the AGC control is waited for (S306), and the control starts, the comparator 236 compares the digital output signal DS of the ADC 234 with the reference value Vref (S307). When the signal level is less than or equal to Vref, it is determined that there is no output from the transmitter IC 210, and the state transits to the idle state (S302). As illustrated in FIG. 4, transition to the idle state occurs at the timing of L when the level of the output 403 of the ADC 234 becomes equal to or lower than Vref.

When the output of the ADC 234 (input to the comparator 236) exceeds Vref, the normal state is maintained and the gain controller 235 reads the digital output of the ADC (S308). The gain controller 235 generates the gain adjustment signal GC of the VGA 103 based on the digital output signal DS of the ADC 234. In one example, the gain controller 235 stores, in a memory, a table in which an amplification factor required for the VGA 103 is determined in advance corresponding to the digital output signal DS. The gain adjustment signal GC of the VGA 103 is transmitted to the VGA 103, and automatic gain control is performed (S309).

In the gain control, as illustrated in FIG. 4, for example, in an AGC control 405a, when the output level of the CTLE 102 decreases, the output signal waveform 402 decreases. However, the digital output signal of the ADC 234 DS decreased by reflecting a decrease of the level is input to the gain controller 235. In the gain controller 235, the gain adjustment signal GC is generated based on the digital output signal DS, and the gain adjustment signal GC is reflected in control in a subsequent AGC control 405b. In FIG. 4, the level of the output signal waveform 402 is changed for the sake of description of the automatic gain control. However, signals other than the output signal waveform are shown to be constant (not decreased) independently thereof.

Patent Document 2 describes that a level of an output signal of a relay transmitter is converted into a digital value by the ADC, and a control signal for controlling a variable attenuator is generated through a processor (FIG. 4 of Patent Document 2). However, there is no mention of reducing a circuit scale using a digital output of a system from the detector to the ADC not only for AGC but also for squelch control. In the present embodiment, a high-frequency input signal is converted into a low frequency by a detector, a numerical value indicating a signal level is digitized by the ADC 234, and then AGC control and squelch control are performed. Therefore, when compared to a case in which a propagated high-frequency signal is used for control without change, a malfunction caused by noise can be prevented.

Second Embodiment (2-1. Circuit Configuration)

Figure 5:
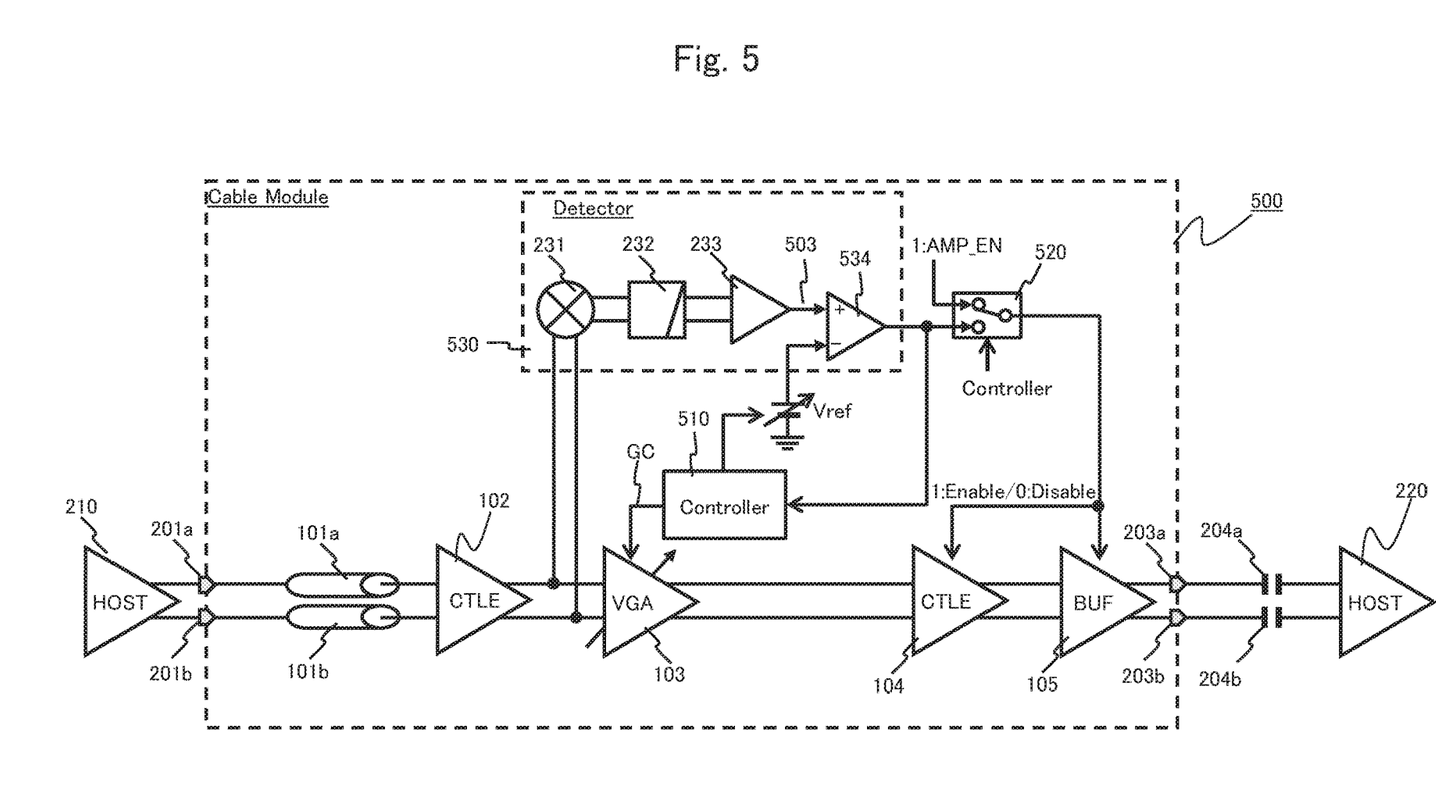
FIG. 5 is a circuit block diagram of a second embodiment of the invention.

FIG. 5 is a circuit block diagram illustrating an electric transmission cable module of a second embodiment of the invention. The same reference symbol will be assigned to the same component as that of the first embodiment of FIG. 2, and a description will be omitted. A different part will be described.

Figure 6:
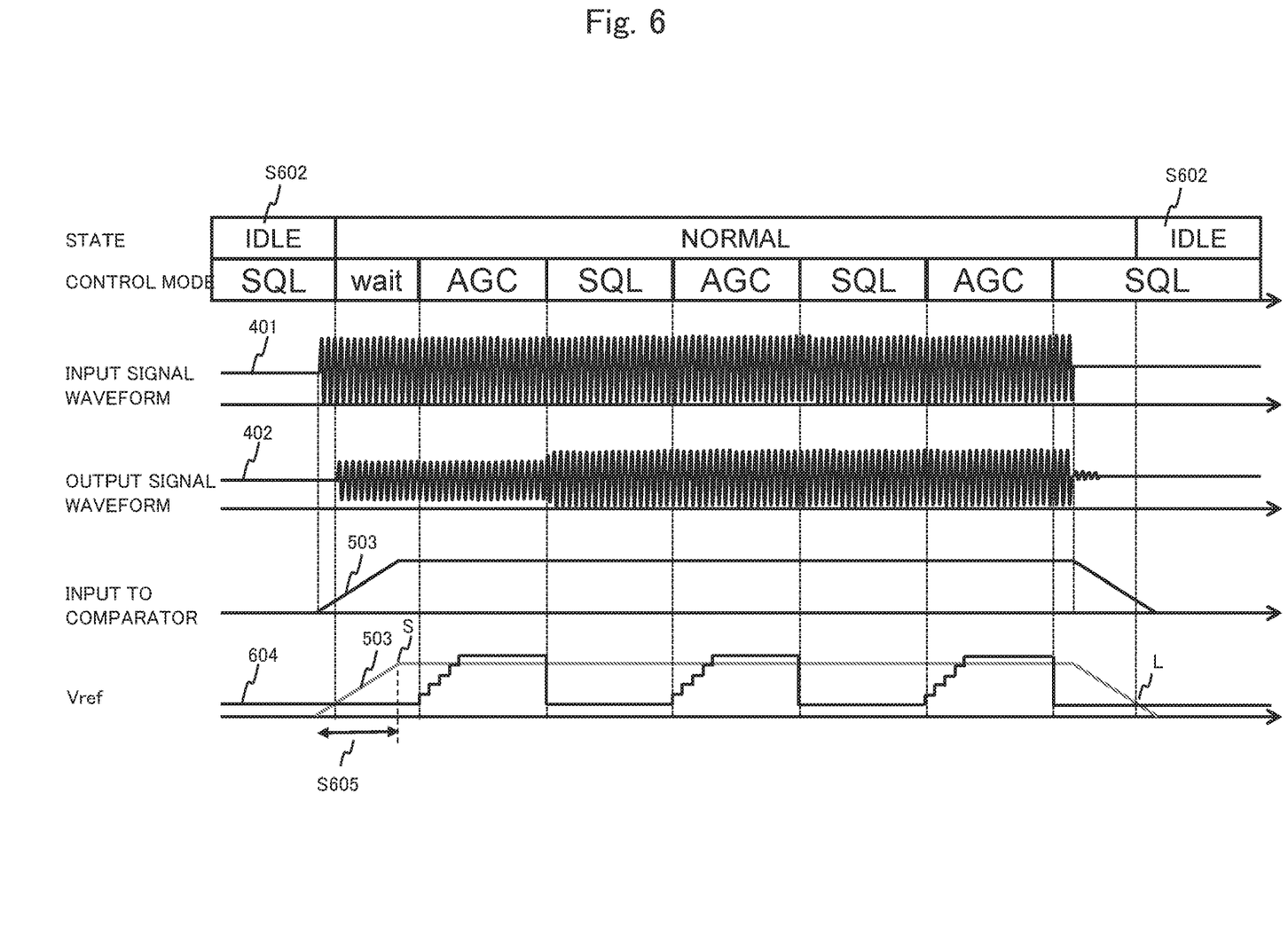
FIG. 6 is a waveform diagram during operation of the second embodiment of the invention.

FIG. 6 illustrates waveforms of the circuit of FIG. 5 during operation. FIG. 6 illustrates a state of an electric transmission cable module 500, a control mode, a waveform of an input signal to the electric transmission cable module 500 (input to an input terminal 201) 401, a waveform of an output signal from the electric transmission cable module 500 (output from an output terminal 204) 402, an input 503 to a comparator 534, and a relationship between a reference value Vref 604 and the input 503 to the comparator 534 in order from the top.

In the present embodiment, a function equivalent to that in the first embodiment is realized by changing a reference voltage of the comparator 534 without using a normal ADC. In the examples of FIGS. 3 and 4, monitoring of the squelch control is performed independently and in parallel during the AGC control. However, in the present embodiment, the AGC control and the squelch control are temporally separated. This control is switched by a switch 520 controlled by a control circuit 510. During the AGC control, the switch 520 is connected to a signal source at a level of "1". Further, an Enable signal is supplied to the CTLE 104 and the buffer amplifier 105, and an operation state is set. During the squelch control, the switch 520 receives an output of the comparator 534 as an input.

The present embodiment includes the detector 530 that contributes to both the squelch function and the AGC function. The detector 530 detects a signal level similarly to the first embodiment of FIG. 2.

An output from the CTLE 102 is connected to the detector 530 separately from the VGA 103, and the detector 530 constantly monitors an output level of the CTLE 102. In the detector 530, a differential output from the CTLE 102 is respectively squared by the mixer 231, a signal is frequency-converted into a DC band, and power is detected in the DC band. A direct current component is extracted from an output of the mixer 231 using a low-pass filter 232, and a voltage level is detected. The voltage level is converted into an appropriate output level to a circuit of a subsequent stage by a linear amplifier 233.

An output level of the linear amplifier 233 is input to the comparator 534. In the present embodiment, a value of a reference value Vref input to the comparator 534 is controlled by the control circuit 510. The comparator 534 can realize functions of both a squelch detector and an ADC detector by varying the reference value Vref.

(2-2. Operation Sequence)

Figure 7:
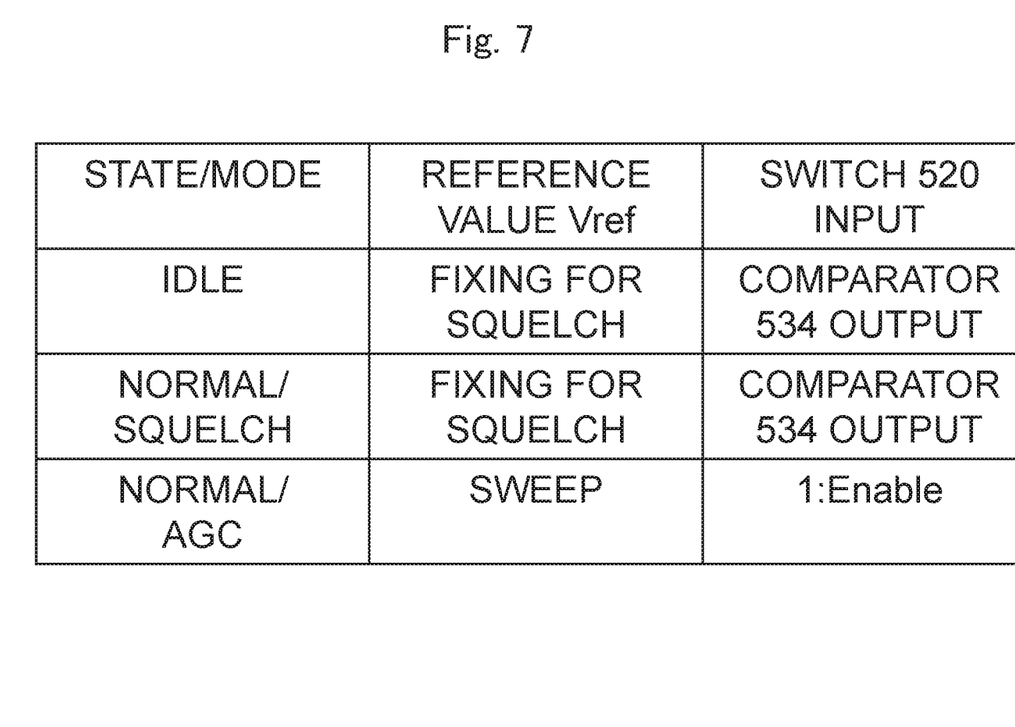
FIG. 7 is a table illustrating settings of a reference value and a switch in each state/mode of the second embodiment of the invention.

FIG. 7 is a table showing settings of the reference value Vref and the switch 520 in each state/mode of the circuit of FIG. 5. In the present embodiment, the signal is switched by the switch 520. However, it is possible to adopt another configuration capable of switching a signal such as a logic circuit.

An operation of the circuit of FIG. 5 will be described with reference to FIG. 5 to FIG. 7. First, when a power supply of an electric transmission cable module 200 is turned ON, the electric transmission cable module 200 transits to an idle state as an initial state (S602).

In the idle state, the control circuit 510 sets the reference value Vref input to the comparator 534 to a fixed reference value for the squelch. Further, the control circuit 510 switches the switch 520 so that an output of the comparator 534 is input. The comparator 534 outputs "0" when the input is equal to or less than the squelch reference value Vref, and outputs "1" when the input exceeds the reference value Vref. The switch 520 directly inputs the output of the comparator 534 to the CTLE 104 and the buffer amplifier 105 as a signal indicating Enable/Disable of the CTLE 104 and the buffer amplifier 105.

In the idle state (S602), when the waveform of the input signal 401 to the electric transmission cable module 200 transits from a signal-free state to a signal-present state (including a high-frequency signal), the detector 530 detects a signal level using the low-pass filter 232 and inputs the detected signal level to the comparator 534 via the linear amplifier 233. As in the first embodiment, a predetermined time is required for a rise of the input of the comparator 534. Therefore, when the input of the comparator 534 exceeds the reference value Vref for the squelch, the state transmits from the idle state to the normal state. However, until the comparator input 503 becomes stable, automatic gain control by the VGA 103 is put in a waiting state (S605). That is, in FIG. 6, the waiting state (S605) continues until the timing indicated by S, and the automatic gain control is held.

In the present embodiment, when a determination voltage of a detection circuit is made variable, both the squelch function and the AGC function are compatible using only one detector. Further, there is an advantage that the ADC is unnecessary and the circuit configuration can be simplified. Therefore, a chip area is reduced and the chip cost is reduced. However, since the squelch function and the AGC function may not be executed at the same time, the squelch function and the AGC function are alternately operated.

As illustrated in FIG. 6, in the normal state, the AGC mode and the squelch mode are alternately executed. In addition to simply alternating as illustrated in FIG. 6, the squelch mode may be executed once while the AGC mode is executed twice. Further, when it is expected that the change in the input is small, the AGC mode may be performed only in an initial stage of operation and then the squelch mode may be continued thereafter.

As illustrated in FIG. 6 and FIG. 7, in the AGC mode in the normal state, the control circuit 510 controls the reference value Vref such that the value sweeps or increases stepwise. The comparator 534 outputs a signal "1" to the control circuit 510 at the timing when the input matches the reference value Vref. The control circuit 510 can detect that the output level of the linear amplifier 233 is equal to the reference value Vref at the timing. Therefore, the VGA 103 is controlled so as to give a gain corresponding to the output level (=reference value). To this end, it is sufficient to preliminarily prepare data of a correspondence table of the input power of the comparator or the reference value and the gain of the VGA, and determine the gain according to the table. In the AGC mode, the input of the switch 520 is fixed to "1" so that the operations of the CTLE 104 and the buffer amplifier 105 are maintained, and the Enable signal is supplied to the CTLE 104 and the buffer amplifier 105. In the present embodiment, the reference value Vref is increased stepwise. However, since it suffices to detect the input signal level, the reference value Vref may be decreased stepwise. Alternatively, a method such as binary search may be used.

As illustrated in FIG. 6 and FIG. 7, in the squelch mode in the normal state, the control circuit 510 fixes the reference value Vref to the squelch reference value Vref. For example, the reference value for the squelch is set to be smaller than the reference value in the AGC mode. In the squelch mode, the input of the switch 520 becomes the output of the comparator 534. The comparator 534 outputs the signal "1" to the switch 520 while the input exceeds the reference value Vref. Further, when the input becomes equal to or less than the reference value Vref, a signal "0" is output to the switch 520. These signals are supplied without change to the CTLE 104 and the buffer amplifier 105 as an Enable signal or a Disable signal. When the signal level is equal to or lower than Vref, it is determined that there is no output from the transmitter IC 210, and the state transits to the idle state (S602). As illustrated in FIG. 6, transition to the idle state is performed at the timing of L when the level of the input 503 of the comparator 534 becomes equal to or lower than Vref.

In FIG. 6, for the sake of description of the automatic gain control, the level of the output signal waveform 402 is changed. However, signals other than the output signal waveform are shown as being constant (not decreasing).

Third Embodiment

Figure 8:
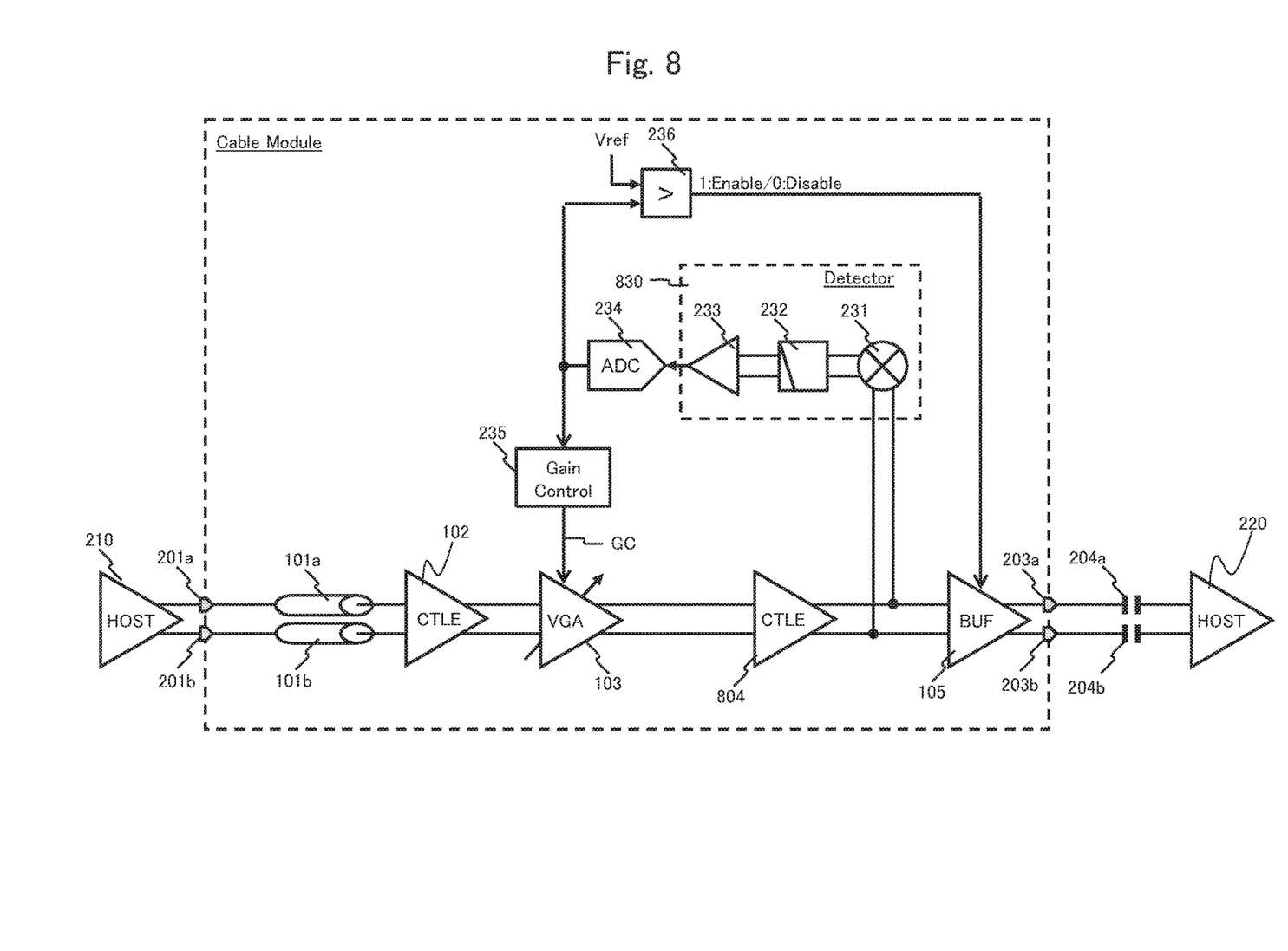
FIG. 8 is a circuit block diagram of a third embodiment of the invention.

FIG. 8 is a circuit block diagram illustrating an electric transmission cable module of a third embodiment of the invention. The same reference symbol will be assigned to the same component as that of the first embodiment of FIG. 2, and a description will be omitted. A different part will be described.

In the embodiment of FIG. 2, the output of the CTLE 102 is used as the input signal to the detector 230. However, in the embodiment of FIG. 8, the output of the CTLE 804 is used as the input signal to the detector 830. Therefore, in the third embodiment, gain control of the VGA 103 corresponds to feedback control. In general, it is easier to reflect a state of a signal to be controlled in control when the feedback control is performed based on a signal from a subsequent stage. In the embodiment of FIG. 8, the squelch control is not performed on the CTLE 804 and performed only on the buffer amplifier 105. Even though the example of FIG. 8 includes two CTLEs, the output of the VGA 103 may be input to the detector 230 by omitting the CTLE 804 at a subsequent stage.

According to the above-described embodiment, it is possible to provide an electric transmission cable module that has both the squelch function and the AGC function and realizes a high-accuracy function while suppressing an increase in chip cost.

The invention is not limited to the above-described embodiment, and includes various modified examples. For example, it is possible to replace a part of a configuration of one embodiment with a configuration of another embodiment, and add a configuration of a certain embodiment to a configuration of another embodiment. In addition, with respect to a part of a configuration of each embodiment, it is possible to add, delete, or replace a configuration of another embodiment.

REFERENCE SIGNS LIST

110, 120, 230, 530, 830: detector
112, 122, 232: low-pass filter
234: ADC
534: comparator

The invention claimed is:

1. An electric transmission cable module comprising:
   a first amplifier that compensates for a cable loss of a conductive cable;
   a second amplifier having a variable gain function;
   a third amplifier allowed to transit between a normal state for amplifying a signal and an idle state having smaller power consumption than power consumption in the normal state;
   a detector that detects a signal level on a signal transmission line between the first amplifier and the third amplifier;
   an analog-to-digital conversion circuit that converts the signal level into a digital signal;
   a first control circuit that generates a gain adjustment signal for controlling a gain of the second amplifier based on the digital signal; and
   a second control circuit that controls transition between the normal state and the idle state of the third amplifier based on the digital signal;
   wherein the detector receives at least one of an output of the first amplifier and an output of the second amplifier as an input.

2. The electric transmission cable module according to claim 1, wherein the detector is a detector employing an envelope detection method using a mixer or an envelope detection method using a nonlinearity of a diode, and includes a low-pass filter having a capacitor as a component.

3. The electric transmission cable module according to claim 1, wherein the first control circuit holds control of the gain of the second amplifier until an output level of the digital signal is stabilized.

4. The electric transmission cable module according to claim 1, wherein the first control circuit generates the gain adjustment signal by referring to data that determines the gain of the second amplifier with respect to an output level of the digital signal.

5. An electric transmission cable module comprising:
   a first amplifier that compensates for a cable loss of a conductive cable;
   a second amplifier having a variable gain function;
   a third amplifier allowed to transit between a normal state for amplifying a signal and an idle state having smaller power consumption than power consumption in the normal state;
   a detector that detects a signal level on a signal transmission line between the first amplifier and the third amplifier;
   an analog-to-digital conversion circuit that converts the signal level into a digital signal;
   a first control circuit that generates a gain adjustment signal for controlling a gain of the second amplifier based on the digital signal; and
   a second control circuit that controls transition between the normal state and the idle state of the third amplifier based on the digital signal;
   wherein the second control circuit detects a magnitude relationship between the digital signal and a reference level and outputs a binary signal for switching a state of the third amplifier based on a detection result.

6. The electric transmission cable module according to claim 5, wherein the detector is a detector employing an envelope detection method using a mixer or an envelope detection method using a nonlinearity of a diode, and includes a low-pass filter having a capacitor as a component.

7. The electric transmission cable module according to claim 5, wherein the first control circuit holds control of the gain of the second amplifier until an output level of the digital signal is stabilized.

8. The electric transmission cable module according to claim 5, wherein the first control circuit generates the gain adjustment signal by referring to data that determines the gain of the second amplifier with respect to an output level of the digital signal.

* * * * *